(12) United States Patent
Sakakibara et al.

(10) Patent No.: US 8,958,259 B2
(45) Date of Patent: Feb. 17, 2015

(54) DEVICE PERFORMING REFRESH OPERATIONS OF MEMORY AREAS

(75) Inventors: Kenichi Sakakibara, Tokyo (JP); Toru Ishikawa, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 88 days.

(21) Appl. No.: 13/444,032

(22) Filed: Apr. 11, 2012

(65) Prior Publication Data

US 2012/0263003 A1    Oct. 18, 2012

(30) Foreign Application Priority Data

Apr. 13, 2011  (JP) .................................. 2011-089607

(51) Int. Cl.
  *G11C 11/40*   (2006.01)
  *G11C 11/406*  (2006.01)
(52) U.S. Cl.
  CPC ............................... *G11C 11/40618* (2013.01)
  USPC ......................................................... 365/222
(58) Field of Classification Search
  CPC ..................................................... G11C 11/40
  USPC ......................................................... 365/222
  See application file for complete search history.

(56) References Cited

U.S. PATENT DOCUMENTS

| | | | |
|---|---|---|---|
| 7,336,557 B2 | 2/2008 | Sawada | |
| 7,466,577 B2 | 12/2008 | Sekiguchi et al. | |
| 7,894,293 B2 | 2/2011 | Ikeda et al. | |
| 7,983,103 B2 | 7/2011 | Tsukude | |
| 8,885,430 B2 | 11/2014 | Sato et al. | |
| 2001/0008496 A1* | 7/2001 | Leung | 365/223 |
| 2003/0231540 A1* | 12/2003 | Lazar et al. | 365/222 |
| 2007/0070765 A1* | 3/2007 | Kim | 365/222 |
| 2007/0145578 A1 | 6/2007 | Lee | |
| 2011/0007594 A1 | 1/2011 | Kim et al. | |
| 2011/0026293 A1* | 2/2011 | Riho | 365/63 |
| 2012/0008436 A1* | 1/2012 | Rajan et al. | 365/194 |

FOREIGN PATENT DOCUMENTS

| | | |
|---|---|---|
| JP | 7-122065 A | 5/1995 |
| JP | 8-138373 A | 5/1996 |
| JP | 2001-35152 A | 2/2001 |
| JP | 2005-222581 A | 8/2005 |
| JP | 2006-277870 A | 10/2006 |
| JP | 2007-140948 A | 6/2007 |
| JP | 2011-081881 A | 4/2011 |

* cited by examiner

*Primary Examiner* — Huan Hoang
*Assistant Examiner* — Min Huang
(74) *Attorney, Agent, or Firm* — Foley & Lardner LLP

(57) ABSTRACT

Disclosed herein is a device that includes a plurality of memory circuits and a refresh control circuit configured to generate a plurality of refresh initiation signals such that one of the refresh initiation signals takes an active level. Each of the memory circuits comprises a memory cell array including a plurality of memory cells, at least one data terminal, a data read/write circuit performing a data read operation to read out read-data from a selected one of the memory cells and supply the read-data to the data terminal and a data write operation to receive write-data from the data terminal and write the write-data into a selected one of the memory cells, and a refresh circuit performing a data refresh operation on selected one or ones of the memory cells of the memory cell array in response to an associated one of the refresh initiation signals taking the active level.

21 Claims, 13 Drawing Sheets

FIG. 13
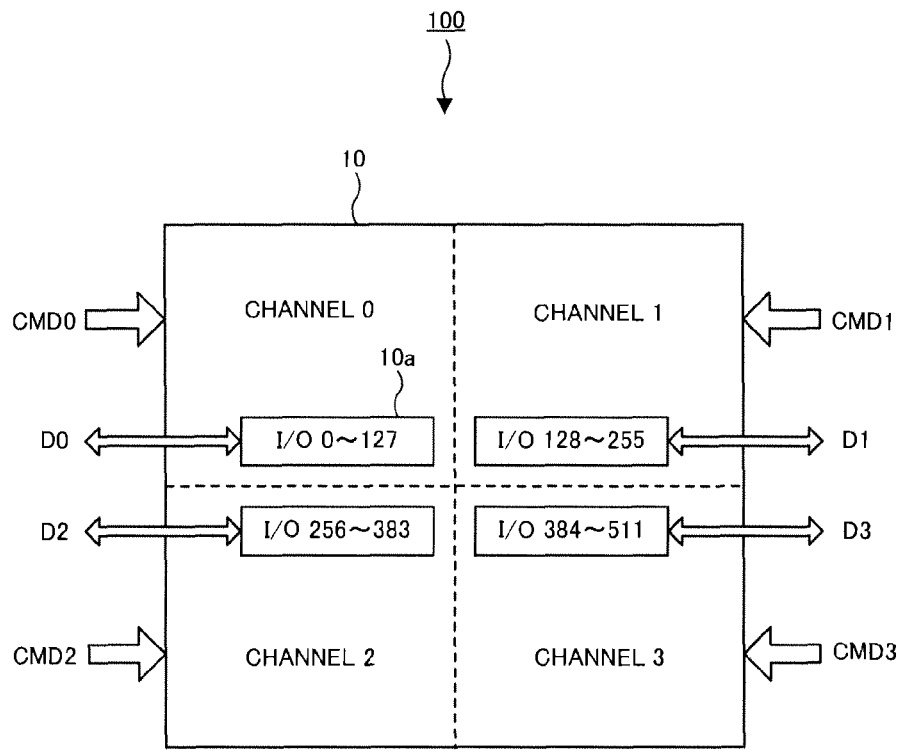
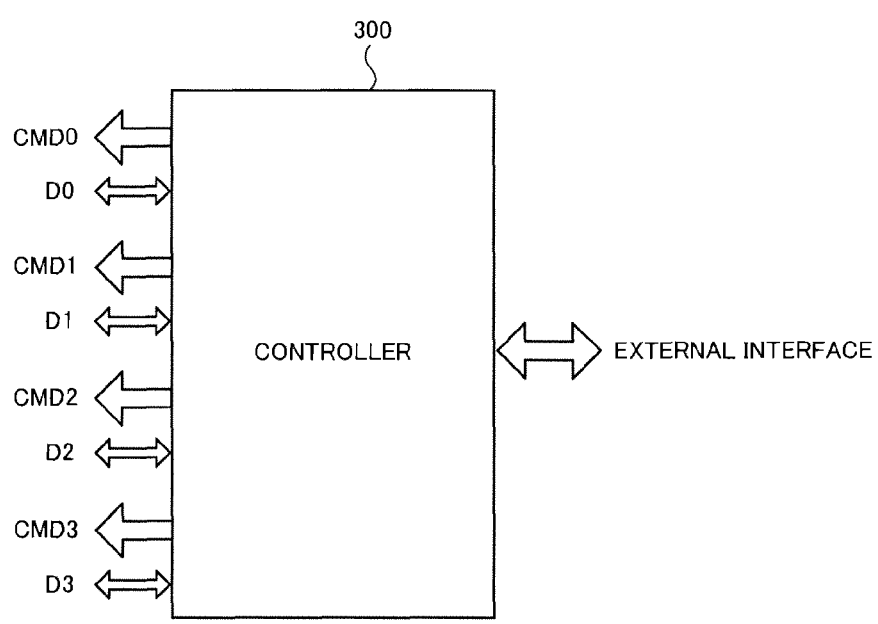

DEVICE PERFORMING REFRESH OPERATIONS OF MEMORY AREAS

This application is based on Japanese patent application no. 2011-089607, filed Apr. 13, 2011, the entire contents of which is incorporated herein by reference.

BACKGROUND OF THE INVENTION

1. Field of the Invention

The present invention relates to a semiconductor device controlling refresh operations of a plurality of memory areas, and relates to a system thereof.

2. Description of Related Art

Generally, in a semiconductor device such as DRAM having a data storage function, it is required to refresh memory cells in a predetermined time interval in order to retain data thereof. There are two refresh modes instructed to the semiconductor device by a controller, which include, for example, auto-refresh and self-refresh. The controller issues a plurality of auto-refresh commands during a predetermined time in the auto-refresh. The controller issues one self-refresh command in the self-refresh. The self-refresh command may be an entry command to enter the self-refresh or an exit command to exit the self-refresh. The semiconductor device performs a refresh operation in the predetermined time interval during a period from the entry command to the exit command. Specifically, the self-refresh is performed using one internal timer (oscillator) provided in the semiconductor device during the above period. In the semiconductor device, a request signal (refresh start signal) for performing the refresh is generated at every predetermined time by using the internal timer. The number of memory cells to be refreshed in response to one request signal is generally larger than the number of memory cells to be refreshed in response to one auto-refresh command. This is due to the fact that semiconductor manufacturers who are familiar with characteristics of the memory cells particularly adjust time setting values of the internal timer in accordance with the characteristics of the memory cells.

Meanwhile, semiconductor devices having a plurality of memory areas are widely used in recent years with an increase in capacity of the semiconductor devices such as DRAM. The plurality of memory areas can have various forms. For example, a semiconductor device comprising a memory cell array divided into a plurality of memory banks (hereinafter, referred to as "a first semiconductor device") and a stacked type semiconductor device in which a plurality of memory chips are stacked (hereinafter, referred to as "a second semiconductor device") can be achieved. In these semiconductor devices, when the respective memory areas are refreshed simultaneously in a self-refresh operation, there arises a problem that large noise is generated by temporal concentration of operation currents in the self-refresh operation. As measures against such a problem, a control method has been proposed in which refresh operations are performed for a plurality of memory banks at different timings (for example, see Patent References 1 and 2), and a control method has been proposed in which refresh operations are performed for a plurality of stacked memory chips at different timings (for example, see Patent References 3 and 4). Here, the plurality of memory banks corresponds to the plurality of memory areas capable of operating asynchronously with one another. The plurality of memory banks included in the first semiconductor device transmit data from/to outside through a common I/O data port (input/output data port) at timings different from one another. Further, the plurality of memory banks receive command and address information corresponding to the plurality of memory areas from outside through a common command port and a common address port at timings different from one another. The command information includes, for example, active/precharge commands for activating/precharging each memory bank, and read/write commands for reading/writing each memory bank. The plurality of memory chips in the second semiconductor device operate through the common I/O data port, the common command port and the common address port, similarly as in the first semiconductor device. However, when managing a system including the semiconductor device, the self-refresh is characterized that the system does not access the semiconductor device entirely within a predetermined time, which is a function that the semiconductor device retains stored data by itself within the predetermined time. Thus, the self-refresh command is a command that deals with the plurality of memory areas (the plurality of memory banks in the first semiconductor device and the plurality of chips in the second semiconductor device) in an integrated manner. Specifically, the controller (included in the system) controlling the semiconductor device issues a first command as a self-refresh entry for starting the self-refresh to the semiconductor device. After the predetermined time, the controller issues a second command as a self-refresh exit for terminating the self-refresh to the semiconductor device. The semiconductor device receives the first and second commands through the above common command port and controls the plurality of memory areas at different timings respectively. Thus, in terms of the self-refresh, the plurality of memory areas are controlled at different timings in the first and second semiconductor devices, which is a sequential delay control synchronized with one self-refresh command.

[Patent Reference 1] Japanese Patent Application Laid-open No. H7-122065

[Patent Reference 2] Japanese Patent Application Laid-open No. H2001-35152

[Patent Reference 3] Japanese Patent Application Laid-open No. 2006-277870 (U.S. Pat. No. 7,466,577)

[Patent Reference 4] Japanese Patent Application Laid-open No. 2007-140948 (U.S. Pat. No. 7,894,293)

The inventors have reviewed a third semiconductor device having a plurality of memory areas capable of being self-refreshed independently of and asynchronously with one another. The third semiconductor device is capable of performing, for example, a self-refresh operation in a first memory area, a read operation in a second memory area, a write operation in a third memory area, and an idle (standby) state in a fourth memory area. Further, the third semiconductor device is capable of shifting the second memory area performing the read operation to a state of the self-refresh being the same as the first memory area. In other words, the third semiconductor device is common to the first and second semiconductor devices in that the plurality of memory areas perform active, precharge, read and write operations asynchronously with one another, but is obviously different from the first and second semiconductor devices in that the plurality of memory areas can perform self-refresh operations asynchronously with one another. Specifically, in the third semiconductor, the plurality of memory areas are controlled independently of one another in response to a plurality of self-refresh commands received asynchronously with one another. As described above, the conventional method of the self-refresh control is the sequential delay control synchronized with one self-refresh command. In other words, the plurality of memory areas are commonly controlled in response to common self-refresh commands (the first and second commands). However, even when applying the methods of the self-refresh control disclosed in the Patent References 1 to 4 to the third semiconductor device reviewed by the inventors, noise suppression cannot be achieved. Specifically, when the plurality of memory areas shift to the state of the self-refresh independently of and asynchronously with one another, there arises a problem that the noise due to overlapping of operations cannot be effectively suppressed. Thus, when reviewing the third semiconductor device, it is required to reduce noise associated with the self-refresh, the amount of which is larger than that of the auto-refresh.

SUMMARY

A device according to an embodiment of the disclosure comprises: a plurality of memory areas operating independently of one another; a plurality of control circuits respectively controlling self-refresh operations of the memory areas independently and asynchronously; an oscillator outputting an oscillator signal having a first period; and a refresh start signal generation circuit generating a plurality of refresh start signals having a second period longer than the first period based on the oscillator signal, the refresh start signals having activation timings different from one another. In one of the memory areas corresponding to one of the control circuits that externally receives a self-refresh request is refreshed in response to an activation timing of a corresponding one of the refresh start signals.

In another embodiment of the disclosure, a device comprises, on a single semiconductor chip, a plurality of memory circuits and a refresh control circuit configured to generate a plurality of refresh initiation signals such that one of the refresh initiation signals takes an active level while remaining one or ones of the refresh initiation signals are taking an inactive level. Each of the memory circuits comprises a memory cell array including a plurality of memory cells, at least one data terminal, a data read/write circuit performing a data read operation to read out read-data from a selected one of the memory cells and supply the read-data to the data terminal and a data write operation to receive write-data from the data terminal and write the write-data into a selected one of the memory cells, and a refresh circuit performing a data refresh operation on selected one or ones of the memory cells of the memory cell array in response to an associated one of the refresh initiation signals taking the active level.

In still another embodiment of the disclosure, a device comprises a first semiconductor chip and a second semiconductor chip electrically coupled to the first semiconductor chip, in which the second semiconductor chip comprises: a first memory cell array, a plurality of first data terminals, a first data read/write circuit configured to perform data transfer between the first memory cell array and the first data terminals, a first refresh circuit configured to perform a first data refresh operation on the first memory cell array in response to an active level of a first refresh initiation signal, a second memory cell array, a plurality of second data terminals, a second data read/write circuit configured to perform data transfer between the second memory cell array and the second data terminals, a second refresh circuit configured to perform a second data refresh operation on the second memory cell array in response to an active level of a second refresh initiation signal, and a first refresh control circuit configured to respond to a first refresh command for the first memory cell array and a second refresh command for the second being issued in parallel to each other and produce the first and second refresh initiation signals such that the first refresh initiation signal takes the active level while the second refresh initiation signal is taking substantially an inactive level and the second refresh initiation signal takes the active level while the first refresh initiation signal is taking substantially an inactive level.

BRIEF DESCRIPTION OF THE DRAWINGS

FIG. 13 is a diagram showing a configuration example of a system comprising a semiconductor device having the configuration described in the embodiments and a controller controlling operations of the semiconductor device.

DETAILED DESCRIPTION OF THE PREFERRED EMBODIMENTS

Embodiments of the invention will be described. It is apparent that the invention is not limited to embodiments described below, but should be construed based on the disclosure of the claims.

Figure 1:
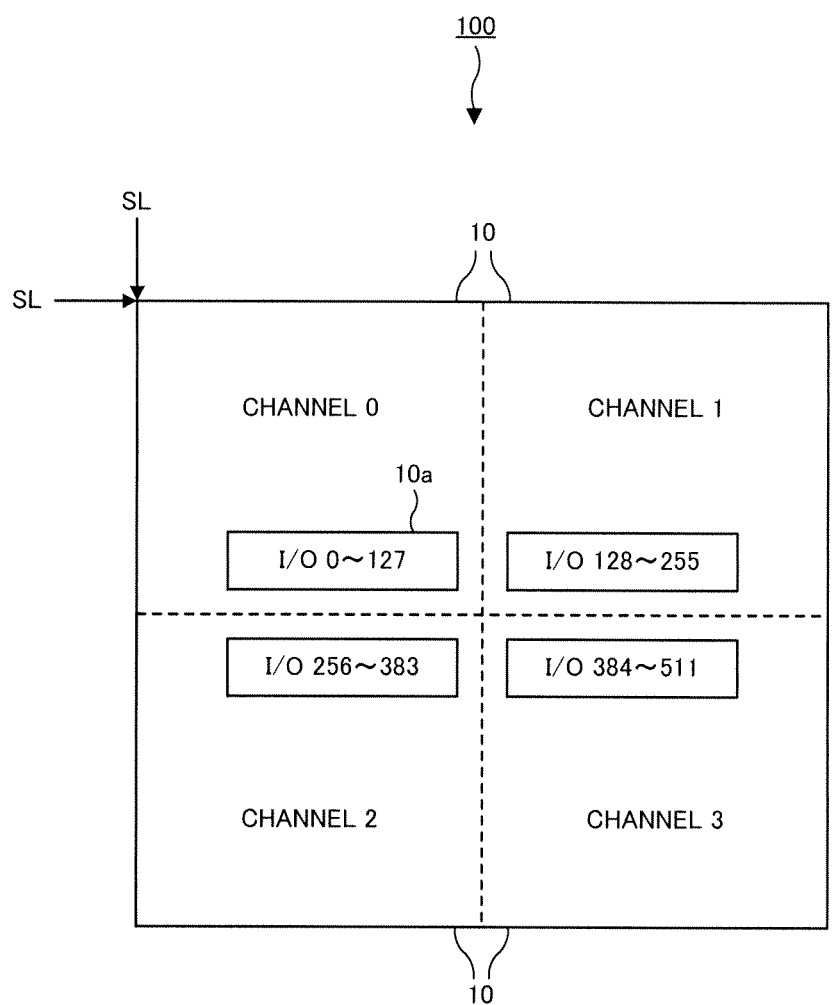
FIG. 1 is a schematic diagram of a semiconductor device of an embodiment.

FIG. 1 shows a schematic diagram of a semiconductor device 100 of an embodiment, which is formed on one chip. The semiconductor device 100 shown in FIG. 1 is configured using, for example, four DRAMs (Dynamic Random Access Memories) 10 having a volatile storage function arranged on a single chip (semiconductor chip), which is called a Wide I/O DRAM. Each DRAM 10 includes an interface 10a having terminals for sending and receiving data, commands and addresses. Each interface 10a is called a channel. In FIG. 1, the four DRAMs 10 (the plurality of memory areas) are represented as channels (0, 1, 2 and 3) respectively (hereinafter, the DRAMs 10 of the channels 0 to 3 may be referred to simply as channels 0 to 3). Each DRAM 10 is capable of independently controlling operations including, for example, a read operation, a write operation and a refresh operation under the control of a later-described control circuit. The respective channels 0 to 3 can operate independently and asynchronously in a manner in which, for example, the channel 0 is in a self-refresh mode, the channel 1 is in a read mode, the channel 2 is in a write mode, and the channel 3 is in an idle mode (standby mode).

Further, the number of I/Os of 128 bits (data width capable of inputting/outputting simultaneously) is assigned to each of interfaces 10a of the four DRAMs 10, and thus the four DRAMs 10 have the number of I/Os of 512 bits in total (I/O 0 to 511). Thus, later-described FIG. 13 discloses a controller (300) that independently controls the semiconductor device 100 including the four channels. In addition, FIG. 1 shows scribe lines SL surrounding the four DRAMs 10 of the semiconductor device 100. The scribe lines SL are cutting lines for cutting out each one chip including the semiconductor device 100.

Although the four DRAMs 10 are included in the semiconductor device 100 in FIG. 1, the number of DRAMs 10 is not limited to four. Further, it is possible to employ a structure in which a plurality of DRAMs 10 are formed on two or more chips, as shown in later-described FIGS. 9 and 10, without being limited to the structure in which the plurality of DRAMs 10 are formed on one chip.

Figure 2:
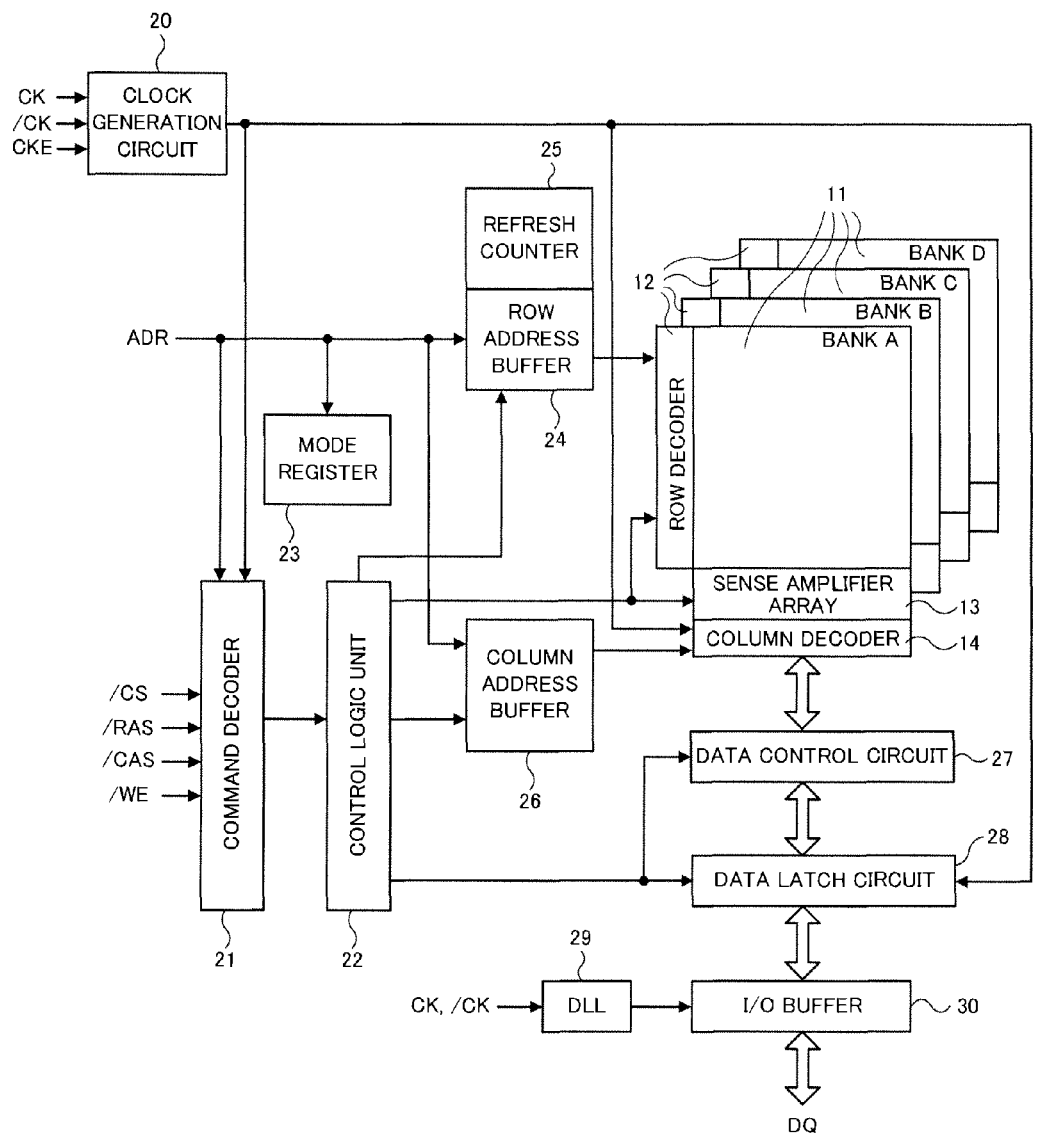
FIG. 2 is a block diagram showing an entire configuration of a DRAM of the semiconductor device of FIG. 1.

FIG. 2 is a block diagram showing an entire configuration of an example of the DRAM 10 of FIG. 1. Thus, the semiconductor device 100 includes four blocks each of which is shown in FIG. 2. The DRAM 10 of FIG. 2 comprises a memory cell array 11 including a plurality of memory cells (not shown), and circuits attached to the memory cell array 11 that include a row decoder 12, a sense amplifier array 13 and a column decoder 14. The DRAM 10 of FIG. 2 further comprises a clock generation circuit 20, a command decoder 21, a control logic unit 22, a mode register 23, a row address buffer 24, a refresh counter 25, a column address buffer 26, a data control circuit 27, a data latch circuit 28, a DLL (Delay Locked Loop) 29, and an I/O buffer 30. In addition, the plurality of control circuits correspond to control logic units 22 each shown in FIG. 2. Further, elements attached to each interface 10a of FIG. 1 includes the plurality of control circuits (including the clock generation circuit 20, the command decoder 21, the mode register 23, the row address buffer 24, the column address buffer 26, the DLL 29 and the I/O buffer 30) each of which transmits control signals, an address signal and data from/to outside.

The memory cell array 11 is divided into a plurality of memory banks. In the example of FIG. 2, four memory banks (represented as memory banks A, B, C and D) are illustrated (four-memory bank configuration). Each memory bank includes the plurality of memory cells formed at intersections of a plurality of word lines and a plurality of bit lines (not shown). The row decoder 12 selects a word line of each memory bank corresponding to a row address. The sense amplifier array 13 includes a plurality of sense amplifiers respectively connected to the bit lines. The column decoder 14 selects a bit line of each memory bank corresponding to a column address.

The memory cell array 11 forms a memory unit integrally with peripheral circuits including the row decoder 12, the sense amplifier array 13 and the column decoder 14. Since the memory unit formed by the memory cell array 11 is a volatile memory unit, a refresh operation for retaining data of the memory cells is required in a predetermined time interval. A refresh control for the plurality of memory banks in the memory cell array 11 is performed so that the memory banks are sequentially refreshed at timings different from one another. This is performed by utilizing the configuration and method disclosed in the above Patent Reference 2. For example, after the DRAM 10 shifts from the standby mode (idle mode) to the self-refresh mode (that is, after the self-refresh entry), the self-refresh is performed in the predetermined time interval. The refresh operation of the embodiment will be described in detail later.

Meanwhile, the clock generation circuit 20 receives clock signals CK, /CK and a clock enable signal CKE from outside, and generates internal clocks to supply them to respective parts of the DRAM 10. The command decoder 21 receives control signals (/CS, /RAS, /CAS and /WE) and an address signal ADR from outside, and determines a command for the DRAM 10 to send it to the control logic unit 22. The control signals (/CS, /RAS, /CAS and /WE) are supplied from command terminals included in the interface 10a. The command decoder 21 and the clock generation circuit 20 recognize the above-described self-refresh commands (entry and exit commands of the self-refresh) and auto-refresh commands. Hereinafter, the self-refresh will be occasionally referred to simply as "refresh". When the auto-refresh and the self-refresh need to be distinguished from each other, they may be attached with phrases "auto" and "self" respectively. The command decoder 21 further recognizes an active command ACT and a precharge command PRE for activating and precharging each memory bank (the row decoder 12, the memory cell array 11 and the sense amplifier 13 are activated and precharged) and a read command RD and a write command WT for transmitting data from/to the memory cell array 11 (the column decoder 14, the data control circuit 27, the data latch circuit 28 and the I/O buffer are activated). The control logic unit 22 controls the respective parts of the DRAM 10 in accordance with the command determined by the command decoder 21. The mode register 23 selectively sets operation modes of the DRAM 10 based on the address signal ADR. Later described multiplexer and oscillator are also controlled based on the mode register 23.

The row address buffer 24 stores the row address included in the address signal ADR and send it to the row decoder 12. The refresh counter 25 counts the row address and outputs a count value as a refresh address every time when activating the refresh start signal RS in the self-refresh operation. The refresh counter 25 further counts the row address and outputs a count value as a refresh address every time when receiving the auto-refresh command from the command decoder 21 in the auto-refresh operation. The column address buffer 26 stores the column address included in the address signal ADR to send it to the column decoder 14. Data transfer between the memory cell array 11 and the I/O buffer 30 is performed through the data latch circuit 28 under the control of the data control circuit 27. The I/O buffer 30 inputs/outputs data from/to outside via input/output terminals DQ (data terminals) in synchronization with a timing controlled by the DLL 29.

Figure 3:
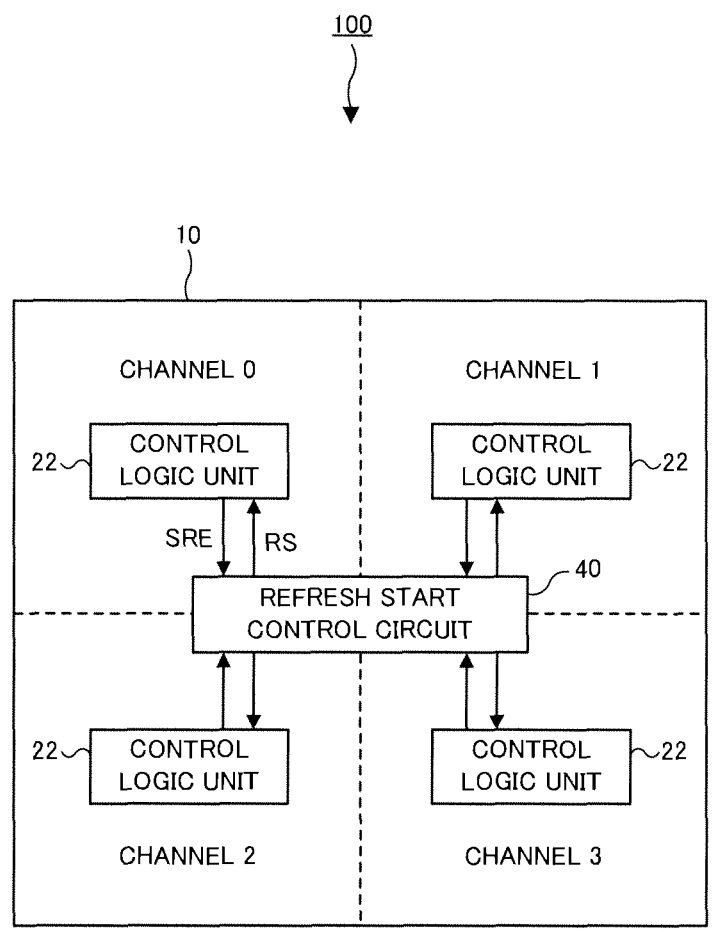
FIG. 3 is a schematic diagram in which a common refresh start control circuit common to channels 0 to 3 is added to the schematic diagram of FIG. 1.

Next, configuration and operation particularly associated with the refresh operation in the semiconductor device 100 of FIG. 1 will be described with reference to FIGS. 3 to 7. FIG. 3 shows a schematic diagram showing a common refresh start control circuit 40 common to the channels 0 to 3 in addition to the schematic diagram of FIG. 1. The refresh start control circuit 40 is a circuit associated with the self-refresh, which is not associated with the auto-refresh. The refresh start control circuit 40 sends and receives data from/to the respective control logic units 22 of the four DRAMs 10, and controls refresh start timings in self-refresh operations that are performed independently and asynchronously in the channels 0 to 3, as described later. Timings when the channels 0 to 3 enter the self-refresh depend on case by case. Although a region for arranging the refresh start control circuit 40 inside the chip is not restricted, it may be arranged in a predetermined area near the center of the chip, or it may be arranged in an empty area of any DRAM 10 of the channels 0 to 3.

Figure 4:
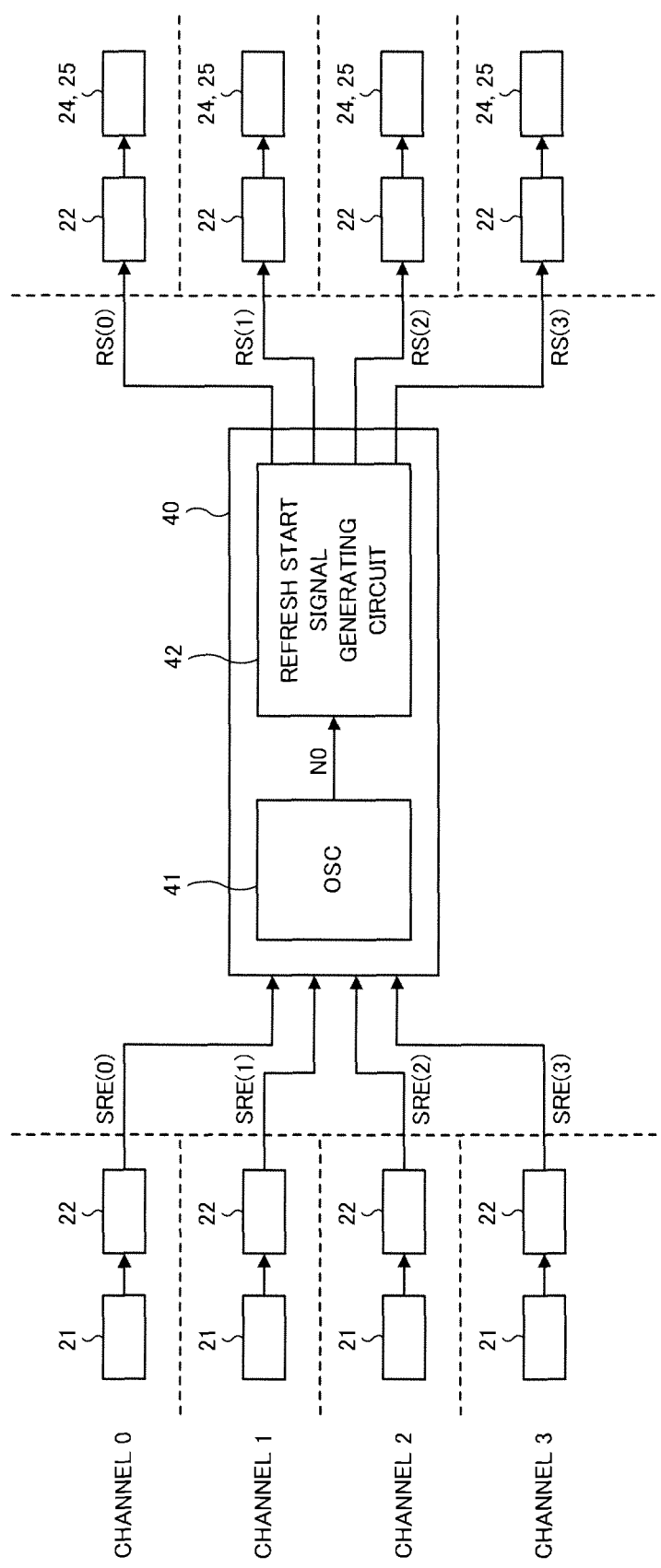
FIG. 4 is a diagram explaining signal transmissions between the refresh start control circuit of FIG. 3 and the respective channels 0 to 3.

Here, signal transmissions between the refresh start control circuit 40 of FIG. 3 and the respective channels 0 to 3 will be described with reference to FIG. 4. The refresh start control circuit 40 includes an oscillator 41 outputting an oscillator signal NO having a predetermined period and a refresh start signal generating circuit 42 generating a plurality of refresh start signals RS for giving refresh start timings in the refresh operations of the channels 0 to 3. As shown in FIG. 4, the refresh start control circuit 40 receives a plurality of self-refresh entry signals SRE from the corresponding control logic units 22, which are based on determination results of the command decoders 21, and generates a plurality of refresh start signals RS in the refresh start signal generating circuit 42 so as to send them to the row address buffers 24 and the refresh counters 25 of the corresponding channels 0 to 3 through the respective control logic units 22. However, note that the refresh start signals RS are outputted corresponding to channels that have received the self-refresh entry signals SRE. Specific description thereof will be made later in FIG. 6.

Each of the self-refresh entry signals SRE is activated by the control logic unit 22 when receiving the self-refresh command (refresh request) for the DRAM 10 via the command decoder 21, and FIG. 4 shows four self-refresh entry signals SRE(0) to SRE(3) corresponding to the respective channels 0 to 3. Among these, one or more self-refresh entry signals SRE to be refreshed allow both the oscillator 41 and a decoder 53 to be active, which will be described in detail later. Further, each of the refresh start signals RS is used to control a refresh start timing of the self-refresh performed in the predetermined period in the DRAM 10 of the corresponding channel, and FIG. 4 shows four refresh start signals RS(0) to RS(3) corresponding to the respective channels 0 to 3.

Figure 5:
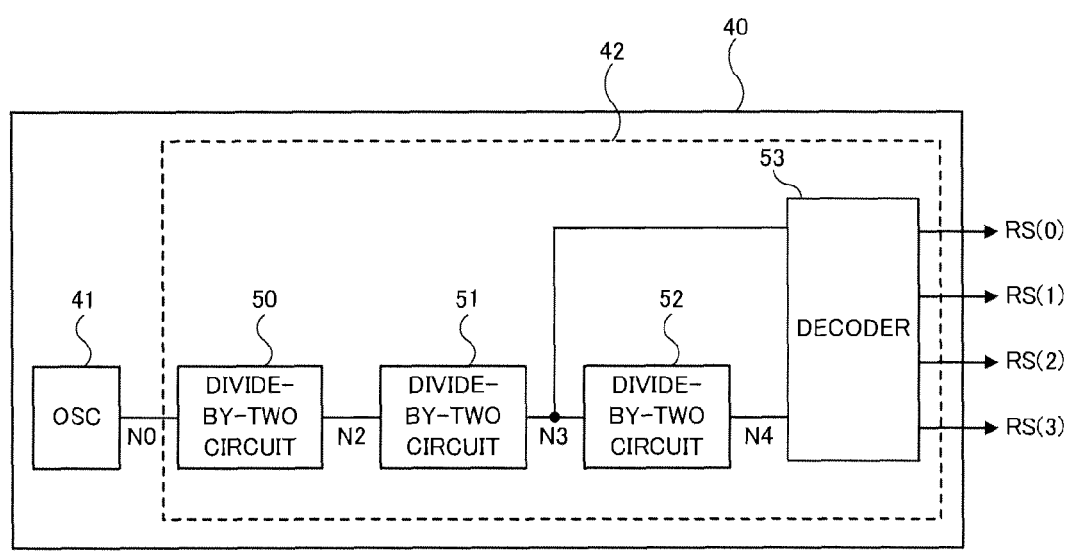
FIG. 5 is a diagram showing a specific configuration example of the refresh start control circuit of the embodiment.

FIG. 5 shows a specific configuration example of the refresh start control circuit 40. As described previously, the refresh start control circuit 40 includes the oscillator 41 and the refresh start signal generating circuit 42. The refresh start signal generating circuit 42 includes three-stage divide-by-two circuits 50, 51 and 52 that form a dividing circuit, and the decoder 53.

In FIG. 5, the oscillator 41 is an oscillation circuit outputting the oscillator signal NO having a predetermined basic period. The basic period of the oscillator signal N is set, for example, to 1 μs. Each of the divide-by-two circuits 50, 51 and 52 that are connected in cascade is configured, for example, with flip-flops. The first divide-by-two circuit 50 divides the oscillator signal N0 of the oscillator 41 by two, and outputs a divided signal N2 having a period twice that of the oscillator signal N0. The second divide-by-two circuit 51 outputs a divided signal N3 by further dividing the divided signal N2 of the divide-by-two circuit 50 by two, and the third divide-by-two circuit 52 outputs a divided signal N4 by further dividing the divided signal N3 of the divide-by-two circuit 51 by two. That is, the divided signal N3 has a period four times that of the basic period, and the divided signal N4 has a period eight times that of the basic period. For example, when the basic period of the oscillator signal NO is 1 μs, the divided signals N2, N3 and N4 have respective periods of 2 μs, 4 μs and 8 μs in this order.

Figure 6:
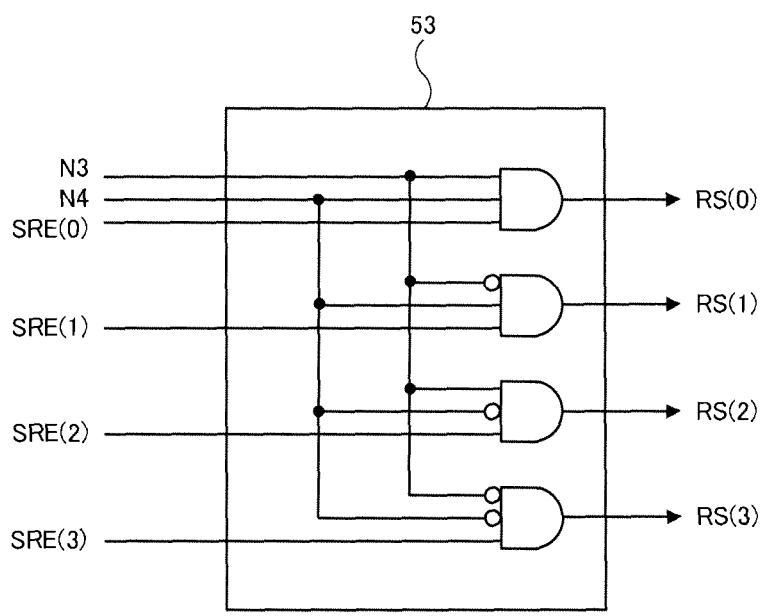
FIG. 6 is a diagram showing an example of a logic circuit of a decoder of FIG. 5.

Further, the decoder 53 decodes the divided signals N3 and N4 from the divide-by-two circuits 51 and 52 and outputs the refresh start signals RS(0) to RS(3) for the respective channels. Since the decoder 53 does not directly receive the divided signals N2 of the divide-by-two circuit 50, the oscillator 41 may be assumed to include the divide-by-two circuit 50. In this case, the oscillator 41 is assumed to operate with a period of 2 μs. Here, FIG. 6 shows an example of a logic circuit of the decoder 53. The decoder 53 shown in FIG. 6 receives the above self-refresh entry signals SRE(0) to SRE(3) in addition to the divided signals N3 and N4. The decoder 53 includes four AND gates, and when the self-refresh entry signals SRE(0) to SRE(3) are activated respectively, the decoder 53 outputs the refresh start signals RS(0) to RS(3) that are activated at corresponding timings. When focusing attention on the divided signals N3 and N4, since combinations of inverted inputs of the divided signals N3 and N4 to the four AND gates are different from one another, rising edges of the refresh start signals RS(0) to RS(3) can be controlled so as not to overlap one another, which will be described in detail later.

Although the configuration example of FIG. 5 shows a case in which the refresh start signal generating circuit 42 includes the three-stage dividing circuit, the number of stages of the dividing circuit in not limited to three. That is, N divide-by-two circuits connected in cascade may be provided in the refresh start signal generating circuit 42. For example, by adding one or more divide-by-two circuits to the configuration example of FIG. 5 so as to configure an N-stage (at least four-stage) dividing circuit, a divided signal having a period $2^N$ times as long as a period T of the oscillator signal NO is generated and $2^{(N-1)}$ refresh start signals RS can be generated. Thereby, the embodiment can be applied even when the number of channels in the semiconductor device 100 increases.

Figure 7:
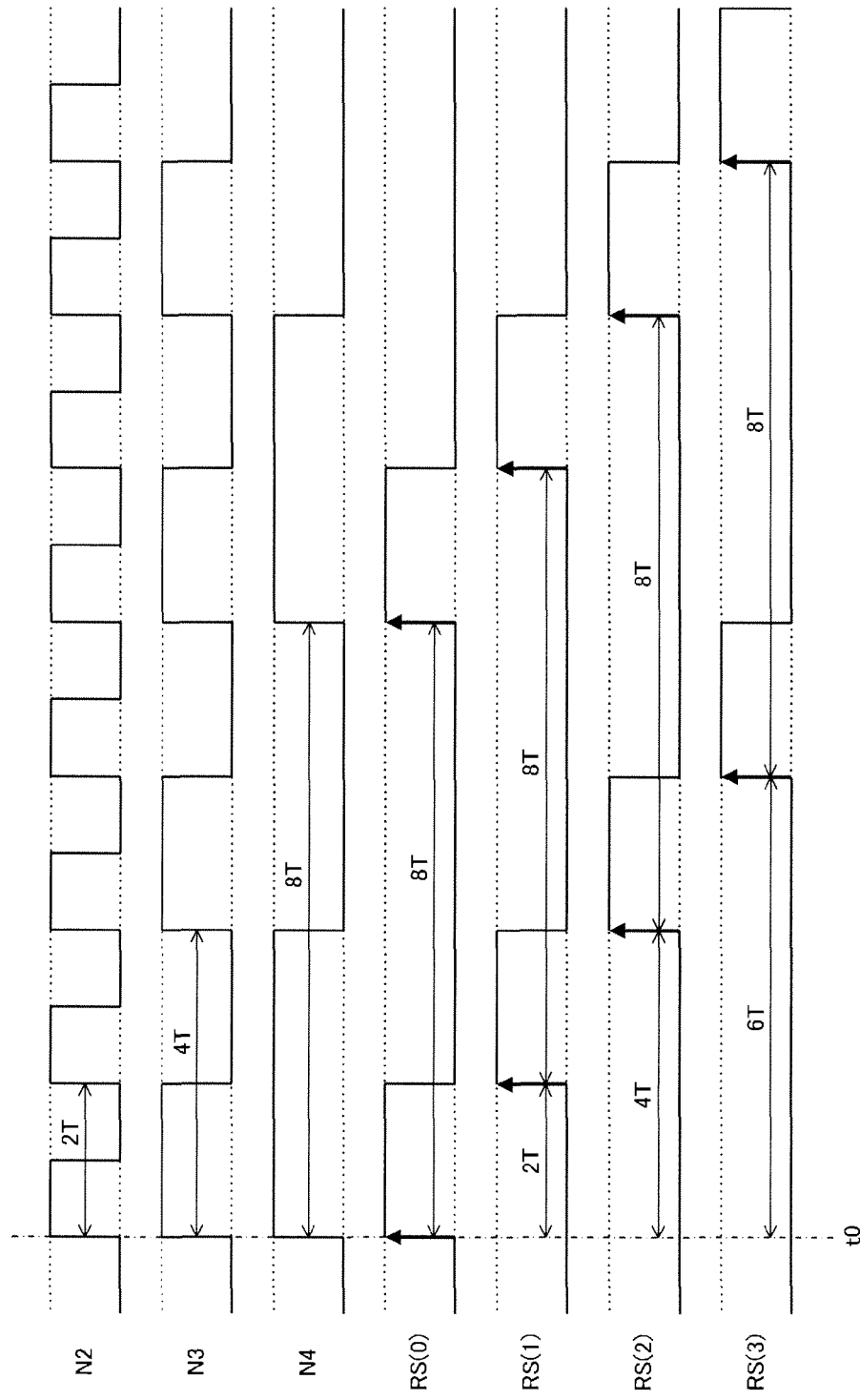
FIG. 7 is a timing waveform diagram of the refresh start control circuit of the embodiment.

Next, an operation of the refresh start control circuit 40 of FIG. 5 will be described. FIG. 7 shows a timing waveform diagram of the refresh start control circuit 40 when performing the self-refresh for the DRAMs 10 of the channels 0 to 3 of FIG. 1. Here, the oscillator 41 is assumed to output the oscillator signal N0 having the period T (the first period). Thus, the divided signal N2 from the divide-by-two circuit 50 is assumed to have a period 2T twice the period T, the divided signal N3 of the divide-by-two circuit 51 is assumed to have a period 4T four times the period T, and the divided signal N4 of the divide-by-two circuit 52 is assumed to have a period 8T (the second period) eight times the period T. For example, assuming that T=1 μs, the respective periods of the divided signals N2, N3 and N4 become 2 μs, 4 μs and 8 μs in this order.

Further, the refresh start signals RS(0) to RS(3) of the channels 0 to 3 are generated by the decoder 53 based on the above divided signals N3 and N4. Assuming that logic levels of the divided signals N3 and N4 are represented as [N3, N4], the refresh start signal RS(0) of the channel 0 becomes a high level when [N3, N4]=[1, 1] based on the configuration of the decoder 53 of FIG. 6. Similarly, the refresh start signal RS(1) of the channel 1 becomes a high level when [N3, N4]=[0, 1], the refresh start signal RS(2) of the channel 2 becomes a high level when [N3, N4]=[1, 0], and the refresh start signal RS(3) of the channel 3 becomes a high level when [N3, N4]=[0, 0]. Here, all of the above refresh start signals RS have a period 8T and a duty ratio of 0.25 (pulse width is 2T). Thus, the respective refresh start signals RS(0) to RS(3) have the same period. The phase of the refresh start signal RS(2) is delayed by 180 degrees with reference to the refresh start signal RS(0). The phase of the refresh start signal RS(1) is delayed by 90 degrees with reference to the refresh start signal RS(0). The phase of the refresh start signal RS(3) is delayed by 270 degrees with reference to the refresh start signal RS(0).

As shown in FIG. 7, from a starting point at which the refresh start signal RS(0) rises first at a timing t0, the refresh start signals RS(1), RS(2) and RS(3) sequentially rise at timings when times 2T, 4T and 6T elapse respectively. As a result, the self-refresh operations in the DRAMs 10 of the channels 0 to 3 have refresh start timings in accordance with the refresh start signals RS(0) to RS(3), and the refresh start timings deviate from one another by one period (time 2T) of the divided signal N2 thereof. Thus, it is possible to prevent the refresh start timings of the respective refresh operations from temporally overlapping one another in the DRAMs 10 of the channels 0 to 3, thereby suppressing influence due to noise between the channels 0 to 3 in the refresh operations.

Although FIG. 7 shows the example in which the refresh start signals RS(0) to RS(3) are activated when the DRAMs 10 of all the channels 0 to 3 enter the self-refresh, only part of the refresh start signals RS may be activated. That is, it can be assumed that the refresh start signals RS of FIG. 7 are generated for the DRAMs 10 of channels to be self-refreshed by the self-refresh entry signals SRE and the refresh start signals RS are not generated for the DRAMs of other channels.

As described above, in each of the channels 0 to 3 corresponding to the refresh start signals RS(0) to RS(3), the plurality of memory banks in the memory cell array 11 included in the corresponding channel are sequentially refreshed at timings different from one another in response to one-time activation (one edge) of the corresponding refresh start signal RS.

Figure 8A:
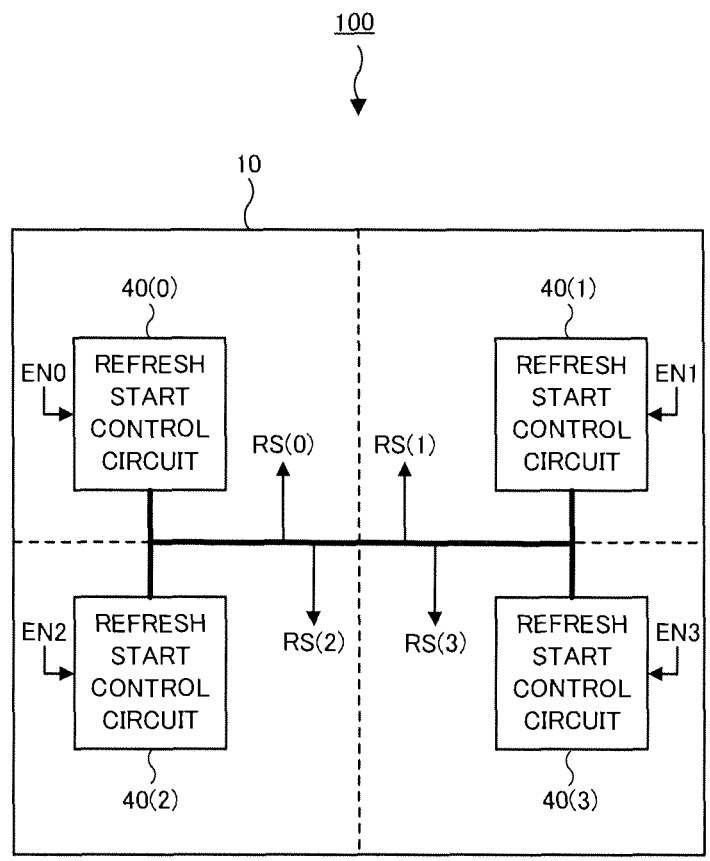
FIGS. 8A and 8B are block diagrams showing a modification of the semiconductor device of the embodiment.
Figure 8B:
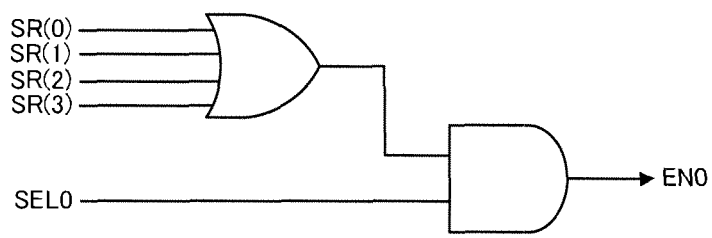

Various modifications can be applied to the semiconductor device 100 of the above embodiment without being limited to the configurations and operations described using FIGS. 3 to 7. FIGS. 8A and 8B show a modification of the semiconductor device 100 of FIG. 3. Although FIG. 3 shows the case in which one refresh start control circuit 40 is arranged inside the chip, this modification shows a case in which four refresh start control circuits 40 of the channels 0 to 3 are arranged inside the chip, as shown in FIG. 8A. That is, refresh start control circuits 40(0) to 40(3) are arranged in the DRAMs 10 of the channels 0 to 3. Each of the refresh start control circuits 40 receives an enable signal EN (EN0 to EN3) and outputs the refresh start signal RS, which has the same specific configuration as in FIG. 5.

One of four enable signals EN0 to EN3 corresponding to the channels 0 to 3 is selectively activated. Here, FIG. 8B shows a configuration example of a generation circuit generating the enable signal EN0 for the refresh start control circuit 40 corresponding to the channel 0. As shown in FIG. 8B, signals SR(0) to SR(3) corresponding to the self-refresh entry signals SRE(0) to SRE(3) of the channels 0 to 3 are inputted to an OR gate, an output of the OR gate and a selection signal SEL0 are inputted to a subsequent AND gate, and the AND gate outputs the enable signal EN0. Thus, when the selection signal SEL0 is at a high level and at least one of the self-refresh entry signals SRE(0) to SRE(3) is at a high level, the enable signal EN0 is activated to a high level. At this point, selection signals SEL1 to SEL3 of other channels 1 to 3 are at a low level respectively, and the enable signals EN1 to EN3 are maintained at a low level as an inactive state. In this manner, it is assumed in the modification that only one of the four refresh start control circuits 40 is used. Although a chip area becomes larger than that in FIG. 3, the respective DRAMs 10 can be commonly designed by employing the modification of FIG. 8. As to the selection signal SEL0, it is desirable to select the selection signals SEL of the refresh start control circuit 40 corresponding to the oscillator 41 operating in the shortest period. This is because that a refreshing performance (measurement of a refresh interval) of each DRAM 10 is individually tested in a wafer state and an oscillator period appropriate for the refreshing performance of each DRAM 10 is adjusted. Accordingly, when the four DRAMs 10 are controlled using one oscillator period, it is desirable to select the oscillator 41 set to the shortest oscillator period.

Figure 9:
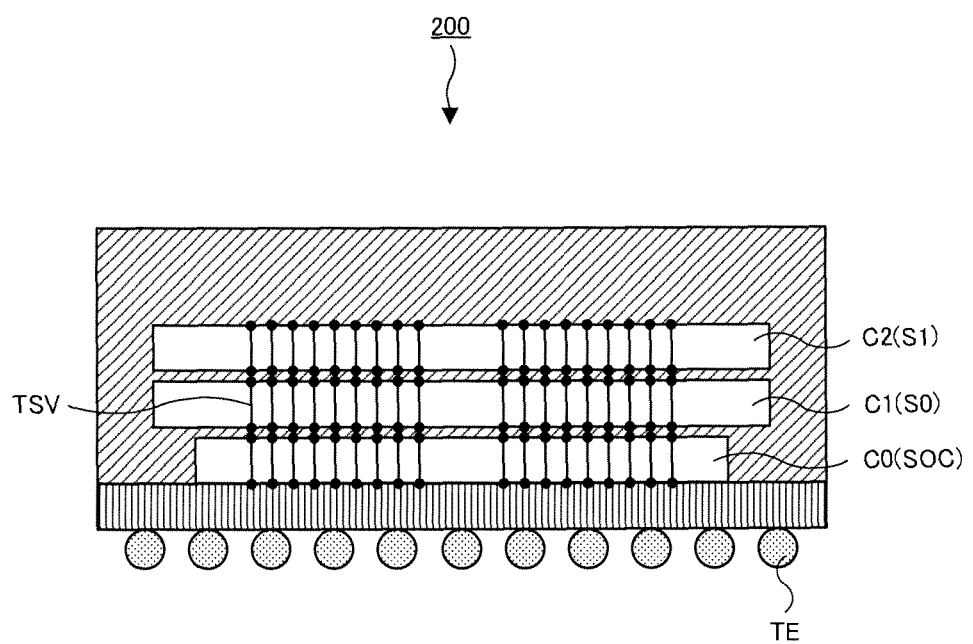
FIG. 9 is a cross-section structural view of a semiconductor device of another embodiment.

Hereinafter, a semiconductor device of another embodiment will be described. The semiconductor device of this embodiment is a stacked type semiconductor device in which chips including the semiconductor device 100 (FIG. 1) are stacked. FIG. 9 schematically shows a cross-section structural view of 2 a semiconductor device 200 of the embodiment, and FIG. 10 is a conceptual diagram showing a connection relation of the semiconductor device 200 of FIG. 9.

The semiconductor device 200 of the embodiment has a structure in which three chips are stacked. That is, chips C0, C1 and C2 are stacked in order from the bottom. The chip C0 (the controller chip) is, for example, a SOC (System on Chip) controlling the semiconductor device 200, and each of the chip C1 (slice S0; the first chip) and the chip C2 (slice S1; the second chip) is, for example, a memory chip including the four DRAMs 10 (FIG. 1). Thus, the semiconductor device 200 is a system in which the chips C0, C1 and C2 are integrally packaged. If the system includes the chips C1 and C2 except the chip C0, it is a semiconductor device as an integrally packaged passive device. Each of the chips C1 and C2 communicates only with the chip C0 under the control of the chip C0. The chip C0 communicates with outside through external terminals TE. The chips C1 and C2 may communicate with each other via a channel control of the chip C0. This is useful, for example, in copying data between channels and in processing data between the channels corresponding to data of the SOC of the chip C0. Further, each of the chips C1 and C2 may be connected to outside through the external terminals TE under the control of the chip C0. Each of the chips C1 and C2 as the memory chip includes four areas corresponding to the channels 0 to 3 (FIG. 10), similarly as in FIG. 1. In the embodiment, the number of chips may be one or two or more. As to the self-refresh in a case of using two or more chips, further features will be described below in the embodiment.

Figure 10:
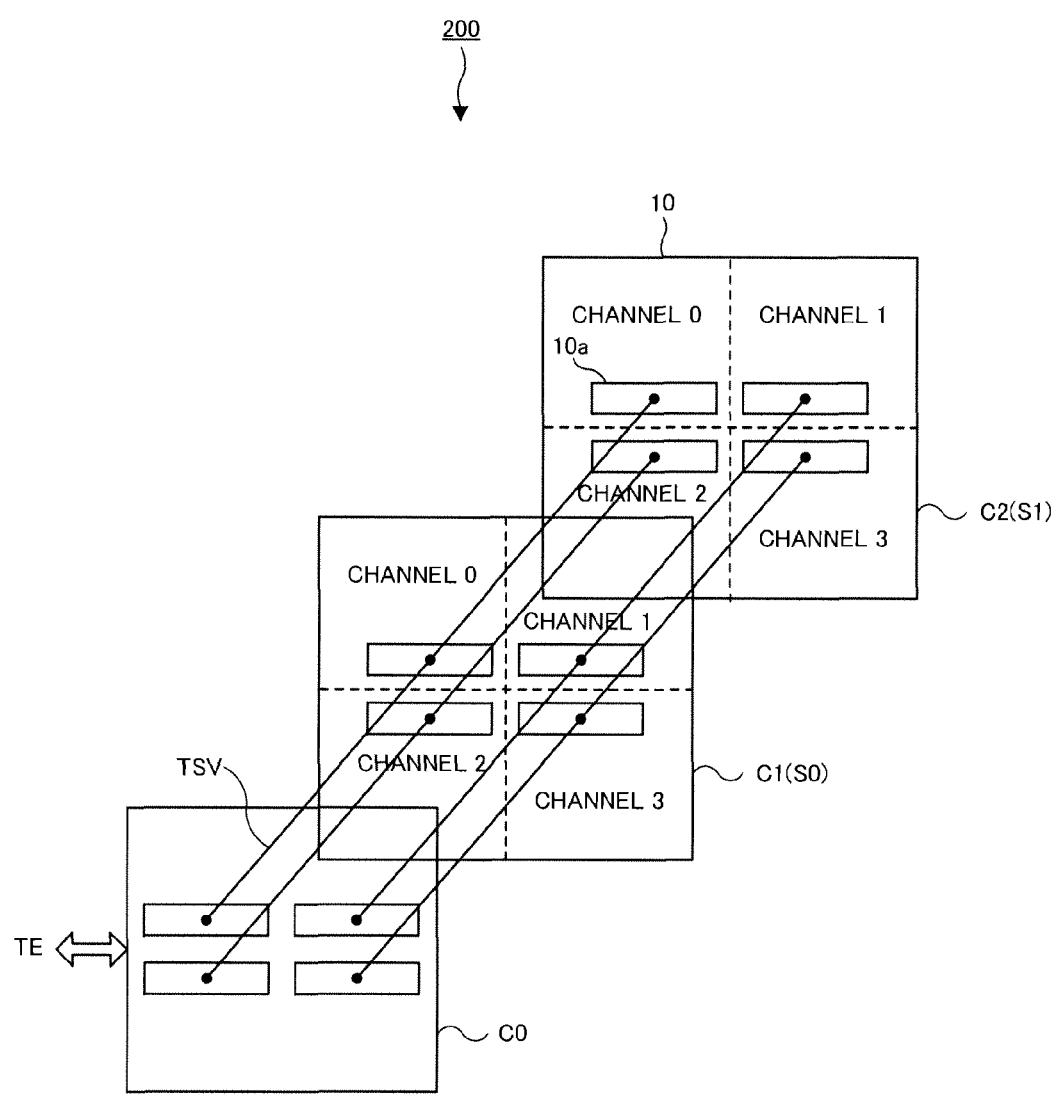
FIG. 10 is a conceptual diagram showing a connection relation of the semiconductor device of FIG. 9.

As shown in FIGS. 9 and 10, corresponding terminals of the chips C0, C1 and C2 are electrically connected to one another by TSVs (Through-Silicon Vias) as through electrodes penetrating the semiconductor device 200 in a stacking direction. Further, a plurality of external terminals TE are formed on a bottom surface of the semiconductor device 200, which are electrically connected to corresponding terminals of the chips C0, C1 and C2. For example, the two divided signals N2 and N3 shown in FIG. 5 can be connected between the chips C1 and C2 by two TSV (TSVa and TSVb of FIG. 11) penetrating the semiconductor device 200. Similarly, other terminals including command terminals and address terminals can be connected between the chips C0, C1 and C2 by a plurality of TSVs (FIG. 9). As schematically shown in FIG. 10, terminals at corresponding positions of the interfaces 10a (FIG. 1) of the chips C0 to C2 are electrically connected to one another by the TSVs.

Figure 11:
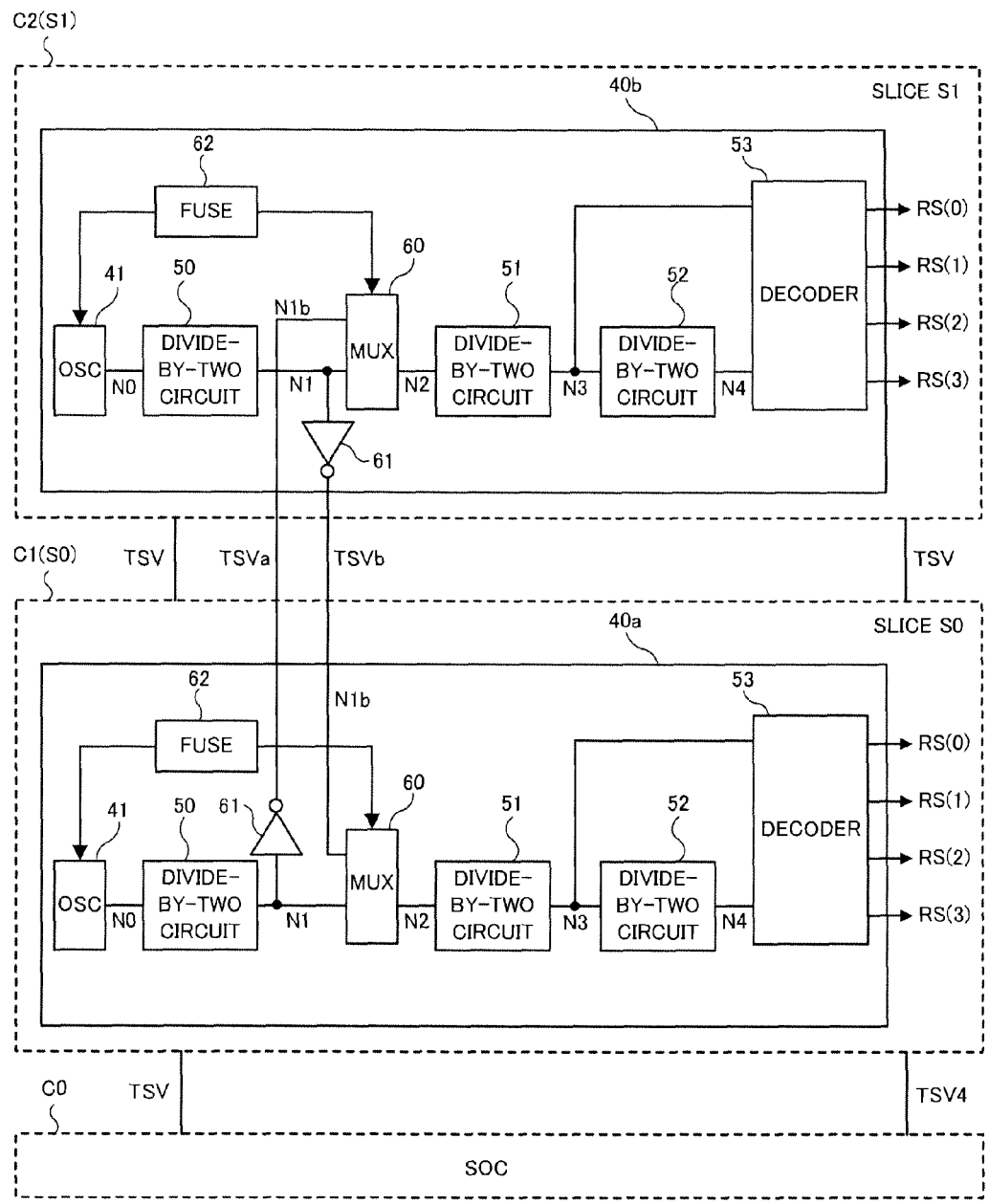
FIG. 11 is a diagram showing a specific configuration example of the refresh start control circuit of the embodiment shown in FIG. 9.

FIG. 11 shows a specific configuration example of two refresh start control circuits 40a and 40b formed in the slices S0 and S1 of the semiconductor device 200 of the embodiment. In the respective refresh start control circuits 40a and 40b, most of components are common to those in FIG. 5, so description thereof will be omitted. In the following description, mainly a difference of this embodiment from FIG. 5 will be described.

As shown in FIG. 11, in the refresh start control circuit 40a of the slice S0, the oscillator 41, and the parts including the divide-by-two circuits 50, 51, 52 and the decoder 53 in the refresh start signal generating circuit 42 are the same as those in FIG. 5, and in addition thereto, there are provided a multiplexer (MUX) 60, an inverter 61 and a fuse 62. The multiplexer 60 is a switch circuit having two input nodes and one output node. Hereinafter, descriptions of the refresh start control circuit 40a of the slice S0 are almost common to the refresh start control circuit 40b of the slice S1. Here, FIG. 11 does not show a border of the refresh start signal generating circuit 42 in the respective refresh start control circuits 40a and 40b.

The divide-by-two circuit 50 of the slice S0 outputs a divided signal N1 having a period twice that of the oscillator signal N0. The divided signal N1 corresponds to the divided signal N2 of FIG. 5. The divided signal N1 is inputted to the multiplexer 60, and an inverted divided signal N1b inverted from the divided signal N1 by the inverter 61 is transmitted through the TSVa into the slice S1 so as to be supplied to the multiplexer 60 of the slice S1. That is, the multiplexer 60 receives the divided signal N1, and the inverted divided signal N1b having a phase different from that of the divided signal N1. Meanwhile, the divide-by-two circuit 50, the multiplexer 60, the inverter 61, and the TSVb of the slice S1 have the same connection relation as the slice S0. That is, each multiplexer 60 of the slices S0 and S1 receives the divided signal N1 of its own side and the inverted divided signal N1b of the other side. In addition, if there are three or more memory chips each including the four DRAMs 10 (FIG. 1), the number of input nodes of the multiplexer 60 may be assumed to increase.

Selection information for selecting either one of the divided signal N1 and the inverted divided signal N1b that are inputted to the multiplexer 60 is stored in each fuse 62 of the slices S0 and S1. Thus, in each multiplexer 60 of the slices S0 and S1, it is possible to control whether to use the divided signal N1 of its own side or to use the inverted divided signal N1b of the other side based on the selection information of the fuse 62. For example, when the divided signal N1 of its own side is used in the multiplexer 60 of the slice S0, the inverted divided signal N1b of the other side is used in the multiplexer 60 of the slice S1. Each multiplexer 60 of the slices S0 and S1 outputs the divided signal N1 of the slice S0 or the inverted divided signal N1b of the slice S1 as the divided signal N2 (a selected one of the first and second oscillator signals) selectively to the subsequent divide-by-two circuit 51 based on the selection information of the corresponding fuse 62. Subsequently, the divide-by-two circuits 51, 52 and the decoder 53 are configured in the same manner as in FIG. 5.

Further, control information for bringing the oscillator 41 into an operating state or a halted state is stored in each fuse 62 of the slices S0 and S1. For example, when the divided signal N1 of its own side is used in the multiplexer 60 of the slice S0 and the inverted divided signal N1b of the other side is used in the multiplexer 60 of the slice S1, the control information of the respective fuses 62 are set so that the oscillator 41 of the slice S0 is brought into the operating state and the oscillator 41 of the slice S1 is brought into the halted state. Thereby, consumption current can be reduced. In addition, it is possible to use a register that stores the selection information supplied from outside instead of the fuse 62. For example, the mode register 23 of FIG. 2 can be used. The mode register 23 may be of a volatile or non-volatile type.

Figure 12:
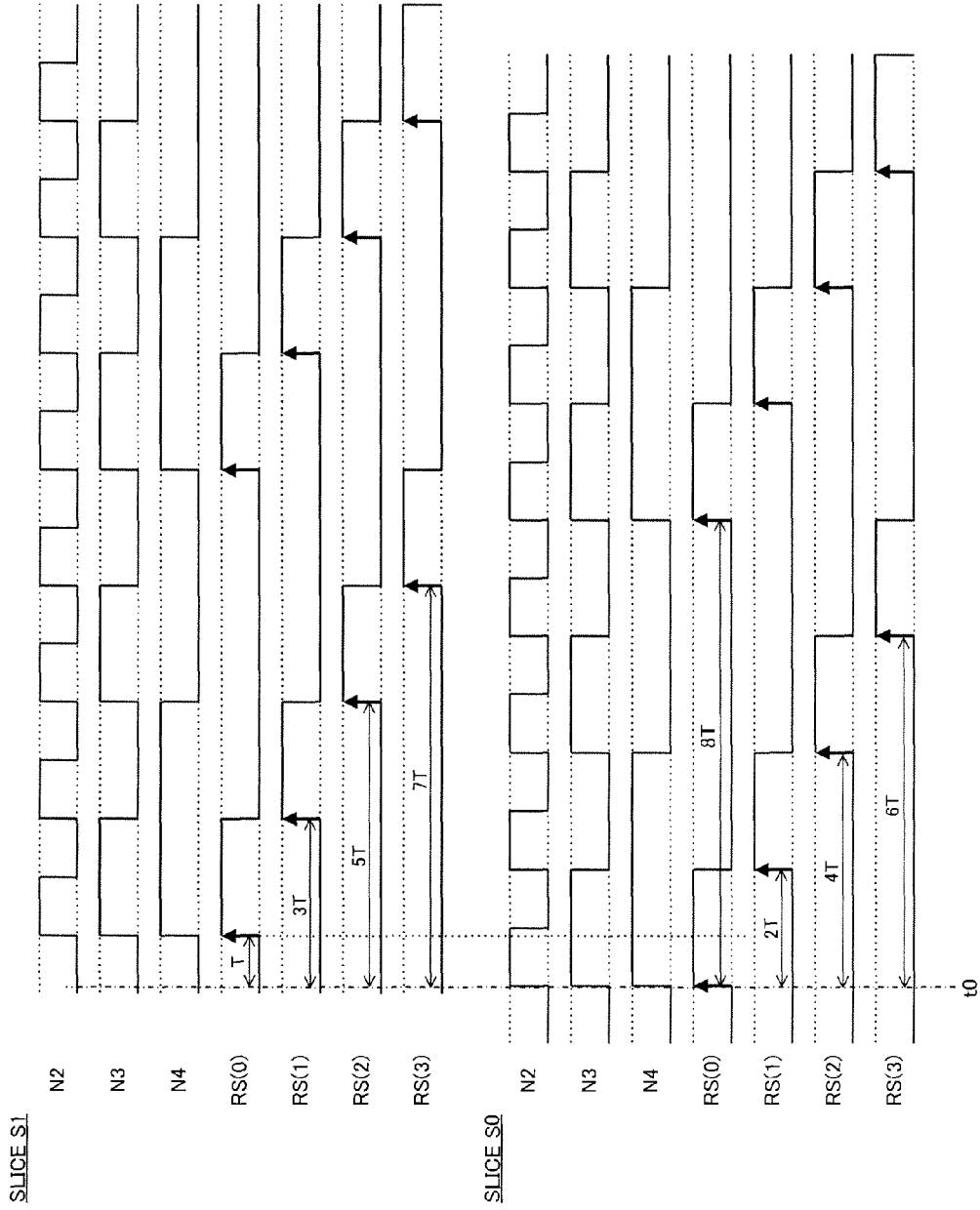
FIG. 12 is a timing waveform diagram of the refresh start control circuit of the embodiment shown in FIG. 9.

Next, an operation of the refresh start control circuits 40a and 40b of the slices S0 and S1 of FIG. 11 will be described. FIG. 12 shows a timing waveform diagram of the refresh start control circuits 40a and 40b when performing the self-refresh for the DRAMs 10 of the channels 0 to 3 regarding the respective slices S0 and S1 of FIG. 11. FIG. 12 shows a case in which the divided signal N1 of the slice S0 (the inverted divided signal N1b sent to the slice S1) is selected by the selection information stored in each fuse 62 of the slices S0 and S1.

In the slice S0, the oscillator signal N0 from the oscillator 41, the divided signals N2, N3 and N4 from the divide-by-two circuits 50, 51 and 52, and the refresh start signals RS(0) to RS(3) from the decoder 53 are respectively generated, which are common to those in FIG. 7. On the other hand, in the slice S0, since the inverted divided signal N1 of the slice S0 is selected in the multiplexer 60, the divided signal N2 having a phase opposite to that of the divided signal N2 of the slice S0 is obtained. In other words, a rising edge of the divided signal N2 of the slice S1 is delayed relative to a rising edge of the divided signal N2 of the slice S0 by a time equivalent to the period T of the oscillator signal N0.

Subsequently, the divided signals N3 and N4 and the refresh start signals RS(0) to RS(3) are sequentially generated with reference to the divided signal N2 of the slice S1. As a result, when comparing corresponding waveforms of the slices S0 and S1, the waveforms of the slice S1 delayed relative to the waveforms of the slice S0 by the time equivalent to the period T. As shown in FIG. 12, assuming that the timing t0 at which the refresh start signal RS(0) of the slice S0 having the period 8T rises is used as a reference, the refresh start signals RS(1), RS(2) and RS(3) of the slice S0 rise at timings t0+2T, t0+4T and t0+6T in this order, and the refresh start signals RS(0), RS(1), RS(2) and RS(3) of the slice S1 rise at timings t0+T, t0+3T, t0+5T and t0+7T in this order. In other words, eight refresh start signals RS of the slices S0 and S1 respectively rise at timings deviated from one another by a time T (the period of the oscillator signal T0). Further, the respective refresh start signals RS have phases deviated from one another by 45 degrees from the timing t0 within a range from 0 to 360 degrees. In the embodiment described above, it is possible to prevent that the refresh operations of the DRAMs 10 of the different slices S0 and S1 temporally overlap each other.

When performing a wafer test of the slices S0 and S1 in the semiconductor device of the above embodiment, the self-refresh operation for each DRAM 10 is tested by using the oscillator 41 of each of the slices S0 and S1. The respective oscillators 41 of the slices S0 and S1 are actually different in speed, as described previously, and if the oscillator 41 of the slice S0 is lower in speed than that of the slice S1, the test is assumed to be performed by using the oscillator 41 of the slice S0. At this point, the timing of the refresh operation of the slice S1 for which the test has been performed immediately therebefore by using the relatively high-speed oscillator 41 of the slice S1 is possibly delayed due to a decrease in speed of the oscillator 41. This causes a risk that a refresh period becomes longer than an actual value of a retention time so that a refresh failure is detected in the test of the slice S1.

As a measure against such a case in the embodiment, it is effective that each fuse 62 of the slices S0 and S1, for example, is set so that the oscillator 41 of the slice S0 is halted and the oscillator 41 of the slice S1 operates. In this manner, in order to perform the test by using a desired oscillator 41 of the slices S0 and S1, each fuse 62 of the refresh start control circuits 40a and 40b can be previously cut in a sorting process or a stacking process, or a register can be used instead of the each fuse 62. A laser fuse (which is cut in a wafer state in the sorting process) or an electric fuse (which is cut from outside after being mounted) can be used, respectively as the fuse 62. Alternatively, by providing a volatile or non-volatile register instead of the fuse 62, the information may be written into the register from the chip C0 (SOC) or outside (through the external terminals TE) when needed.

Next, a case in which the invention is applied to a data processing system comprising the semiconductor device will be described. FIG. 13 shows a configuration example of the data processing system comprising the semiconductor device 100 shown in FIG. 1 and a controller 300 controlling operations of the semiconductor device 100. The controller 300 outputs commands CMD0 to CMD3 for controlling the DRAMs 10 of the channels 0 to 3 of the semiconductor device 100. Further, the controller 300 and the DRAMs 10 of the semiconductor device 100 transmit data D0 to D3 with each other via the interfaces 10a of the respective channels. The DRAMs 10 of the channels 0 to 3 can be accessed independently of and asynchronously with one another based on the commands CMD0 to CMD3 of the controller 300. In each of the DRAMs 10, for example, a read operation, a write operation, an idle state, a self-refresh operation and the like are controlled in accordance with the commands CMD0 to CMD3 and the data D0 to D3. Meanwhile, the controller 300 simultaneously controls, for example, deep power down modes in the DRAMs 10 of the semiconductor device 100.

The data processing system of FIG. 13 is, for example, a system implemented in electronics devices such as personal computers, communication electronics devices, mobile electronics devices and other industrial/consumer electronics devices.

The invention claimed is:

1. A device comprising:
a plurality of memory areas operating independently of one another;
a plurality of control circuits respectively controlling self-refresh operations of the memory areas independently and asynchronously;
an oscillator outputting an oscillator signal having a first period; and
a refresh start signal generation circuit generating a plurality of refresh start signals having a second period longer than the first period based on the oscillator signal, the refresh start signals having activation timings different from one another,
wherein one of the memory areas corresponding to one of the control circuits that externally receives a self-refresh request is refreshed in response to an activation timing of a corresponding one of the refresh start signals.

2. The device according to claim 1,
wherein the control circuits further controls auto-refresh operations of the memory areas independently and asynchronously.

3. The device according to claim 1, further comprising a plurality of command decoders respectively decoding externally input self-refresh commands to instruct self-refresh operations of the memory areas, the command decoders each controlling a corresponding one of the memory areas.

4. The device according to claim 3, further comprising a plurality of command terminals receiving the self refresh commands, the command terminals corresponding to the memory areas respectively.

5. The device according to claim 4, further comprising a plurality of data terminals inputting/outputting data of the memory areas from/to outside independently of and asynchronously with one another, the data terminals corresponding to the memory areas respectively.

6. The device according to claim 2, further comprising a plurality of command decoders respectively decoding externally input self-refresh commands to instruct self-refresh operations of the memory areas and externally input auto-refresh commands to instruct auto-refresh operations of the memory areas, the command decoders each controlling a corresponding one of the memory areas.

7. The device according to claim 6, further comprising a plurality of data terminals inputting/outputting data of the memory areas from/to outside independently of and asynchronously with one another, the data terminals corresponding to the memory areas respectively.

8. The device according to claim 7, further comprising a plurality of command decoders respectively decoding externally input read commands and write commands to instruct operations associated with the inputting/outputting, the command decoders each controlling a corresponding one of the memory areas.

9. The device according to claim 8, further comprising a plurality of command terminals receiving the auto-refresh commands, the read commands and the write commands, the command terminals corresponding to the memory areas respectively.

10. The device according to claim 1,
wherein the respective refresh start signals have a same period.

11. The device according to claim 1,
wherein activation timings of the refresh start signals deviate from one another by the first period.

12. A device comprising, on a single semiconductor chip:
a plurality of memory circuits, each of the memory circuits comprising,
a memory cell array including a plurality of memory cells,
at least one data terminal, and
a data read/write circuit performing a data read operation to read out read-data from a selected one of the memory cells and supply the read-data to the data terminal and a data write operation to receive write-data from the data terminal and write the write-data into a selected one of the memory cells; and
a refresh control circuit configured to generate a plurality of refresh initiation signals based on an externally-received self-refresh request such that one of the refresh initiation signals takes an active level while remaining one or ones of the refresh initiation signals are taking substantially an inactive level;
each of the memory circuits further comprising a refresh circuit performing a data refresh operation on selected one or ones of the memory cells of the memory cell array in response to an associated one of the refresh initiation signals taking the active level.

13. The device as claimed in claim 12, wherein the memory cell array of each of the memory circuits includes a plurality of memory banks each including plural ones of the memory cell arrays, and the refresh circuit of each of the memory circuits performs the data refresh operation on each of the memory banks in sequence.

14. The device as claimed in claim 12, wherein the refresh control circuit is divided into a plurality of sub-control circuits each generating an associated one of the refresh initiation signals, each of the sub-control circuits is contained in an associated one of the memory circuits.

15. A device comprising:
a first semiconductor chip; and
a second semiconductor chip electrically coupled to the first semiconductor chip;
the second semiconductor chip comprising:
a first memory cell array,
a plurality of first data terminals,
a first data read/write circuit configured to perform data transfer between the first memory cell array and the first data terminals,
a first refresh circuit configured to perform a first data refresh operation on the first memory cell array in response to an active level of a first refresh initiation signal,
a second memory cell array,
a plurality of second data terminals, a second data read/write circuit configured to perform data transfer between the second memory cell array and the second data terminals, a second refresh circuit configured to perform a second data refresh operation on the second memory cell array in response to an active level of a second refresh initiation signal, and a first refresh control circuit configured to respond to an externally-received first refresh command for the first memory cell array and an externally-received second refresh command for the second memory cell array being issued in parallel to each other and produce the first and second refresh initiation signals such that the first refresh initiation signal takes the active level while the second refresh initiation signal is taking substantially an inactive level and the second refresh initiation signal takes the active level while the first refresh initiation signal is taking substantially an inactive level.

16. The device as claimed in claim 15, wherein the second semiconductor chip is stacked over the first semiconductor chip, and the first semiconductor chip issues the externally-received first and second refresh commands.

17. The device as claimed in claim 16,
wherein the device further comprises a third semiconductor chip stacked over the first semiconductor chip; and
wherein the third semiconductor chip comprises:
a third memory cell array,
a plurality of third data terminals electrically connected to the first data terminals of the second semiconductor chip,
a third data read/write circuit configured to perform data transfer between the third memory cell array and the third data terminals,
a third refresh circuit configured to perform a third data refresh operation on the third memory cell array in response to an active level of a third refresh initiation signal,
a fourth memory cell array,
a plurality of fourth data terminals electrically connected to the second data terminals of the second semiconductor chip,
a fourth data read/write circuit configured to perform data transfer between the fourth memory cell array and the fourth data terminals,
a fourth refresh circuit configured to perform a fourth data refresh operation on the fourth memory cell array in response to an active level of a fourth refresh initiation signal, and
a second refresh control circuit configured to produce the third and fourth refresh initiation signals such that the third refresh initiation signal takes the active level at a different timing from time when the first refresh initiation signal takes the active level and the fourth refresh initiation signal takes the active level at a different timing from time when the second refresh initiation signal takes the active level.

18. The device as claimed in claim 17, wherein the second semiconductor chip is sandwiched between the first and third semiconductor chips, and the first semiconductor chip includes a plurality of fifth data terminals electrically coupled to the first data terminals of the second semiconductor chip and a plurality of sixth data terminals electrically coupled to the second data terminals of the second semiconductor chip.

19. The device as claimed in claim 18, wherein the second semiconductor chip further comprises a plurality of first penetration electrodes each penetrating through the second semiconductor chip and a plurality of second penetrating electrodes each penetrating through the second semiconductor chip, the first, third and fifth data terminals being connected in common to the first penetrating electrodes, respectively, and the second, fourth and sixth data terminals being connected in common to the second penetrating electrodes, respectively.

20. The device as claimed in claim 19, wherein the third semiconductor chip further comprises a plurality of third penetration electrodes each penetrating through the third semiconductor chip and a plurality of fourth penetrating electrodes each penetrating through the third semiconductor chip, the third penetration electrodes serving as the third data terminals, respectively, and the fourth penetration electrodes serving as the fourth data terminals, respectively.

21. The device as claimed in claim 19, further comprising a wiring substrate including a plurality of electrodes on a first main surface thereof, the first semiconductor chip being mounted over a second main surface of the wiring substrate.

* * * * *